APPARATUS FOR MANUFACTURING SEMI-CONDUCTOR DEVICES

Original Filed Oct. 15, 1953

SERGE PAKSWER
ROBERT G. POHL
INVENTORS.

BY John J. Pederson
THEIR ATTORNEY.

United States Patent Office 2,860,251
Patented Nov. 11, 1958

2,860,251

APPARATUS FOR MANUFACTURING SEMI-CONDUCTOR DEVICES

Serge Pakswer, Elmhurst, and Robert G. Pohl, Chicago, Ill., assignors to The Rauland Corporation, a corporation of Illinois Original application October 15, 1953, Serial No. 386,363. Divided and this application December 11, 1956, Serial No. 627,701

3 Claims. (Cl. 250—49.5)

This invention pertains to a new and improved apparatus for manufacturing electrical devices of the semi-conductor type; more specifically, the invention is directed to a new and improved apparatus for preparing an alloy-type p–n junction upon the surface of a semi-conductor. This application is a division of a copending application of the same inventors, Serial No. 386,363, filed October 15, 1953, now abandoned, for Method and Apparatus for Manufacturing Semi-Conductor Devices, and assigned to the same assignee as the present application.

Semi-conductor devices may be employed for a wide variety of purposes in electrical networks; for example, devices of this type may be utilized as rectifiers, detectors, amplifiers, etc. In many of these devices, it is desirable to employ a composite structure including adjacent semi-conductor layers which exhibit different types of conductivity. In one form of semi-conductor material, conductivity is theoretically considered to result from the migration or movement of "holes"; this type of semi-conductor is generally referred to as exhibiting p-type conductivity. The other general form of semi-conductor is normally referred to as an n-type semi-conductive material and conducts electrical currents by means of the movement or migration of negative charges or electrons. A composite structure including adjacent recrystallized layers of both types of semi-conductive material is usually known as an alloy or diffused junction-type semi-conductor element and may be referred to as a junction transistor or diode. It should be noted that the difference in conductivity characteristics of the two basic forms of semi-conductive material makes it possible to assign different polarities to the two different types; in other words, they may be considered as elements of opposite polarity.

Several different manufacturing techniques have been evolved for producing junction-type semi-conductor elements. For example, it is possible to form a solution of germanium or other semi-conductive material of one polarity and to commence crystallization of a semi-conductor element from the solution, thereafter changing the composition of that solution during the crystallization process so that a portion of the crystallized material is of opposite polarity with respect to the original portion. A more practical method for preparing a junction layer upon the surface of a semi-conductor comprises an alloying process. In accordance with this process, if it is desired to form a p-type junction layer upon the surface of an n-type semi-conductor such as germanium, a so-called "acceptor" element such as indium or gallium is placed upon the surface of the semi-conductor. The semi-conductor and acceptor assemblage is then placed in a mold in an inert gas atmosphere and is heated to a temperature below the melting temperature of the semi-conductor but considerably above the melting point of the acceptor element so that the acceptor element is melted and forms a p-type surface layer with the germanium by diffusing into the crystalline lattice of the germanium. The same type of process may be applied to the formation of an n-type layer upon the surface of a p-type germanium element by utilizing a "donor" element such as antimony. However, this process leads to difficulties in manufacturing a junction-type transistor or similar semi-conductor device, due to the fact that the alloying elements, hereinafter generically referred to as "modifiers," tend to "wet" the hot germanium and to flow over the surface of the semi-conductor in a somewhat unpredictable manner. Consequently, precise positioning of the junction presents a difficult problem, and results in a relatively high shrinkage rate, due to the fact that many semi-conductor devices require precise location of the junction.

It is a primary object of the invention, therefore, to provide a new and improved apparatus for manufacturing junction-type semi-conductor devices, which apparatus effectively minimizes the difficulties and problems associated with the formation of alloy-junction transistors.

It is another object of the invention to provide a new and improved apparatus for forming an alloy-type junction upon a selected limited area of the surface of a semi-conductor.

It is a further object of the invention to provide a new and improved apparatus for precisely determining the location of a junction upon the surface of a semi-conductor.

The invention is directed to apparatus for the manufacture of alloy-type junction transistors. In accordance with the invention, the apparatus comprises an envelope including an electron-gun section and an anode section, the anode section having an anode-entrance opening. The apparatus further icludes an anode structure adapted to be inserted through the anode-entrance opening for removable mounting within the anode section of the envelope; this anode structure includes a receptacle portion for securely holding a semi-conductor and modifier in a predetermined position within the anode section of the envelope. Removable means are provided for sealing the anode-entrance opening, and provision is made for evacuating the envelope. In addition, the apparatus includes means comprising an electron gun, mounted within the electron-gun section of the envelope, for projecting a stream of electrons to impinge upon a limited portion of the receptacle portion of the anode structure.

The features of the invention which are believed to be novel are set forth with particularity in the appended claims. The organization and manner of operation of the invention, together with further objects and advantages thereof, may best be understood by reference to the following description taken in conjunction with the accompanying drawings, wherein like reference numerals refer to like elements in the different figures, and in which:

Figure 1:
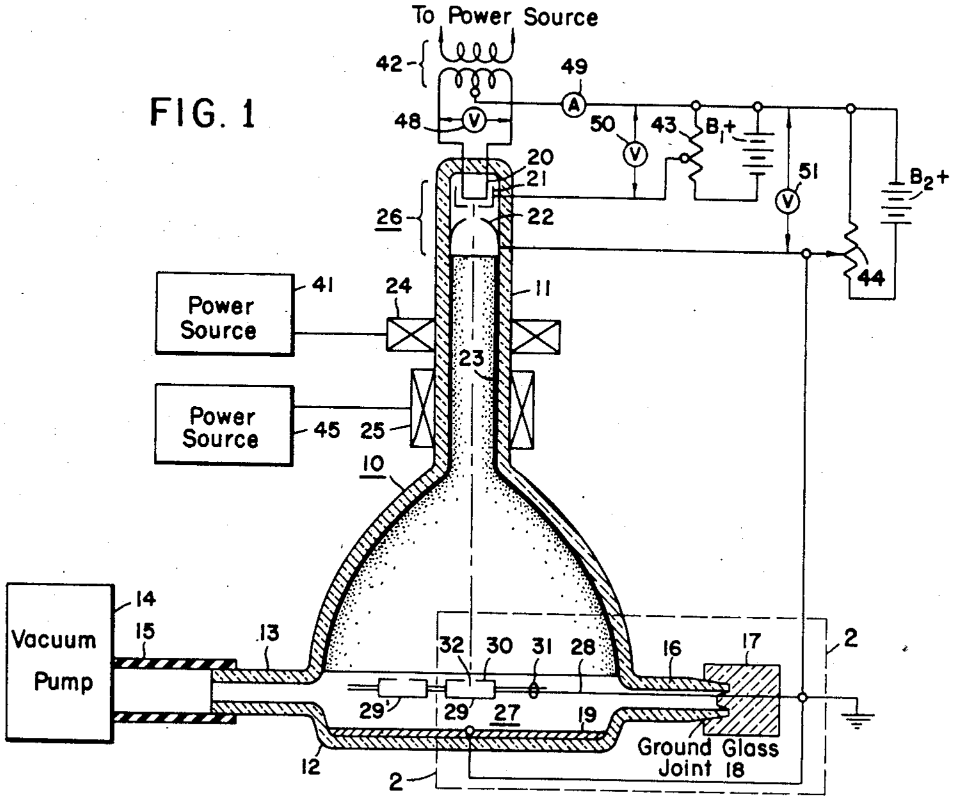
Figure 1 is a cross-sectional view, partially schematic of one embodiment of the apparatus of the invention.

Figure 1 illustrates one form of the apparatus of the invention and comprises an envelope 10 including an electron-gun section or neck 11 and an enlarged anode section 12. Anode section 12 includes an exhaust tube 13 which may be connected to a conventional vacuum pump 14 by means of a conduit 15. Anode section 12 also comprises an additional exit tube or opening 16 which may be sealed by means of a removable cap or closure member 17; preferably, exit tube 16 and cap 17 are both formed from glass and the sealing or mating surfaces of these two elements form a ground-glass joint 18. Anode section 12 may also include an auxiliary anode 19 comprising a metallic plate or a conductive coating on the wall of envelope 10 opposite gun section 11.

A cathode 20, which may comprise an incandescent tungsten filament, is mounted at the end of neck 11 opposite anode section 12; cathode 20 is coupled to a suitable power source (not shown) through a transformer 42. Cathode 20 is encompassed by an apertured control electrode 21; the control electrode is coupled to the variable tap of a potentiometer 43 connected across a source of unidirectional operating potential such as a battery $B_1+$. An apertured accelerating electrode 22 is mounted within neck 11 between cathode 20 and anode section 12, and the inner surface of envelope 10 is covered with a conductive coating 23 starting at accelerating electrode 22 and continuing into a portion of anode section 12. A focusing coil 24 is included in the apparatus and is mounted in encompassing relation to neck 11 at a position intermediate electrode 22 and anode section 12; coil 24 is connected to an energizing means schematically illustrated as power source 41, which may comprise a variable source of D.-C. current. A magnetic-deflection system 25 is also mounted on neck 11 and may be positioned between focus coil 24 and anode section 12. Deflection system 25 is connected to a power source 45, which may be essentially similar to energizing means 41. It should be understood that focus coil 24, deflection system 25 and their associated energizing units 41 and 45 are purely illustrative and may be replaced by any suitable electrostatic or electromagnetic means for focusing and deflecting an electron beam. Furthermore, the electron gun 26 comprising cathode 20, control electrode 21 and accelerating electrode 22 is intended only to show a typical structure and any of the many known types of electron-gun structures may be employed.

The apparatus of Figure 1 further includes an anode structure 27 comprising a support member 28 having a receptacle portion 29; preferably, support member 28 is formed from conductive material and rigidly mounted on cap 17. Anode structure 27 also includes a masking element 30 pivotally mounted on support member 28 by means of a releasable fastener 31. Support member 28, electrode 22, coating 23 and auxiliary anode 19 are each connected to a source of uni-directional positive potential such as a battery $B_2+$ through a potentiometer 44.

Figure 2:
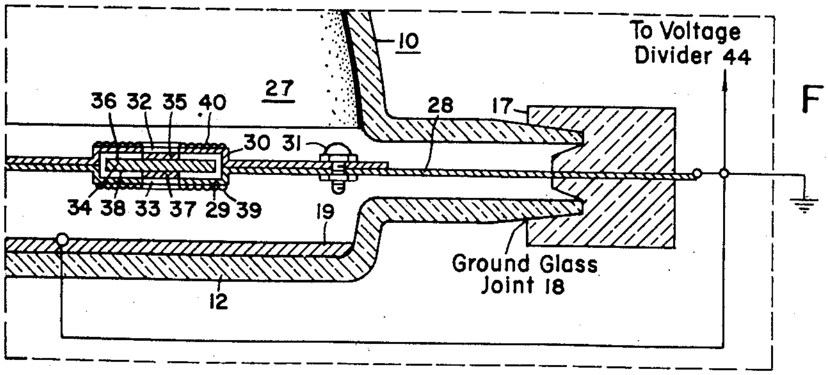
Figure 2 is an enlarged cross-sectional view of a portion of the apparatus illustrated in Figure 1.

That portion of the apparatus of Figure 1 enclosed within dash outline 2 is shown in enlarged detail in Figure 2. As indicated in Figure 2, support member 28 may comprise a simple metal strap in which receptacle portion 29 is formed by punching or some similar process. Preferably, receptacle portion 29 includes a relatively small aperture 33. Mask 30 includes an opening 32 which is preferably substantially identical with opening 33 and is positioned directly opposite opening 33 when mask 30 is in its operating position. As indicated in Figure 2, fastener 31 may comprise a simple bolt arrangement which, when released, permits pivotal movement of mask 30 with respect to support 28. As shown in Figure 1, support member 28 may be extended so that additional receptacles such as receptacle 29' may be formed in the support member and a corresponding number of masks such as element 30 may be mounted thereon. Furthermore, a plurality of individual supporting members each including one or more receptacles may be included in the apparatus.

In order to utilize the apparatus, a semi-conductor element 34 is positioned within the confines of receptacle 29, as shown in Figure 2; semi-conductor 34 may, for example, comprise germanium of the type in which conduction is effected primarily by the movement of electrons. When such n-type germanium is employed, a modifier 35 comprising indium, gallium, or any other suitable acceptor element is deposited upon a limited area of a selected surface 36 of the semi-conductor; if indium is employed; it may be deposited upon the semi-conductor simply by pressing the modifier and semi-conductor together at room temperature. If preferred, the receptacle may be shaped to hold the modifier and semi-conductor in the desired relative positions, or the modifier may be deposited on the germanium by evaporation. Preferably, the area of surface 36 covered by modifier 35 generally corresponds to the area of mask opening 32. Similarly, a modifier 37 of the same type may be applied to the opposite semi-conductor surface 38, with the area covered by modifier 37 corresponding to the area of receptacle opening 33. In utilizing the apparatus of Figures 1 and 2, the semi-conductor and modifier elements should be mounted within receptacle 29 and mask 30 should be placed in the operating position illustrated in Figure 2 before the anode structure is positioned within envelope 10.

After the germanium and modifier elements have been mounted in receptacle 29, anode structure 27 is inserted within section 12 of envelope 10 at the position illustrated in Figure 1, and anode-entrance opening 16 is sealed by cap 17. It will be understood that the surface of ground-glass joint 18 should preferably be coated with a suitable sealing agent such as grease so that a vacuum-tight seal is effected. Envelope 10 is then evacuated by means of pump 14 and electron gun 26 is energized. The electrons emitted from cathode 20 are accelerated by electrode 22 and are focused by a magnetic field established by coil 24. Deflection system 25 is employed to develop a deflection field and to direct the electron stream so that it impinges upon opening 32 of mask 30. The electron beam thus impinges upon modifier 35 (see Figure 2) and heats the modifier and the localized area of semi-conductor surface 36 immediately adjacent the modifier. The heating is continued until the modifier is melted and until the desired type of junction layer is produced; however, care should be taken to insure that the melting temperature of the semi-conductor is not exceeded. Mask 30 prevents the electron stream from impinging upon semi-conductor 34 except in the limited area delineated by aperture 32, so that the remainder of surface 36 is not heated to a temperature high enough to permit the modifier to "wet" the surface, thus minimizing possible flow of modifier 35 over surface 36. When germanium is employed as the semi-conductor material and either indium or gallium as modifiers 35 and 37, the alloying temperature may be within the range from 500° C. to 850° C., since the melting temperature of germanium (958° C.) is well above this range whereas the melting points of indium (155° C.) and gallium (30° C.) are well below the range. The temperature of the modifier and the heated area of the semi-conductor may be readily controlled by adjusting potentiometer 44 to vary the accelerating voltage applied to electrode 22 and coating 23 and/or by adjusting the heat energy applied to cathode 20 from transformer 42 and/or by adjusting the potential of control grid 21 with respect to the cathode by adjusting potentiometer 43. The cross-sectional area of the electron beam as it strikes anode structure 27 may be controlled by suitable adjustments in the energizing current applied to focus coil 24 from power source 41 so that an even smaller area than that delineated by mask aperture 32 may be heated if desired. The position of the beam as it strikes anode structure 27 may of course be controlled by suitably adjusting the energizing current supplied to deflection system 25 from source 45.

As the indium is melted, it forms on surface 36 an alloy-type junction layer of p-type semi-conductive material. Ordinarily, some of the modifier will remain in unalloyed condition and may be employed to provide an electrical connection to the junction layer after the semi-conductor has been removed from receptacle 29 and cooled. In many semi-conductor devices, it is desirable to provide two junction layers positioned exactly opposite each other on opposing surfaces of the semi-conductor. When this type of structure is desired, the double-apertured receptacle-mask structure illustrated in Figure 2 is employed. After the first junction layer has been formed, cap 17 is rotated 180° so that receptacle aperture 33 faces the electron gun section of the tube (Figure 1) and the process is then repeated. In order to assist in properly locating the point at which the electron beam strikes anode structure 27, the surfaces of receptacle 29 and mask 30 may be coated with fluorescent layers 39 and 40 respectively to give a positive indication of the beam location. Where a plurality of individual receptacles corresponding to receptacle 29 are formed in a single anode structure, a corresponding plurality of electron beams may be employed to carry out the process, or, preferably, a single electron beam may be deflected across the anode structure by system 25 to selectively impinge upon the different receptacles.

Figure 3:
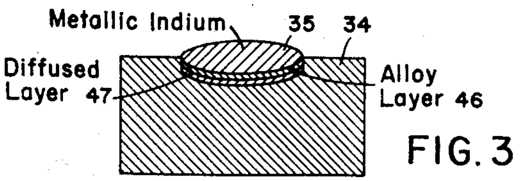
Figure 3 is a simplified cross-sectional view of a semi-conductor device produced with the apparatus of the invention.

The cross-sectional view of Figure 3 illustrates the semi-conductor after the junction has been prepared. As indicated therein, a portion of indium modifier 35 remains unalloyed with the germanium semi-conductor 34. A portion of the indium is alloyed with the germanium, forming a layer 46 of recrystallized germanium having a very high concentration of indium which is conductive in nature. A third and relatively thin junction layer 47 is formed between layer 46 and semi-conductor 34. Junction layer 47 comprises germanium which is not alloyed with the indium and hence not recrystallized; however, indium atoms have migrated into layer 47, mostly by diffusion, so that the junction layer exhibits p-type conductivity as compared to the n-type conductivity of semi-conductor 34. It should be understood that this description of the successive layers formed during the alloying process is an oversimplified theoretical one and is presented primarily for assistance in understanding the overall concept; there are no sharply-defined and precisely identifiable layers in the actual junction structure.

In setting up the apparatus of Figure 1 to carry out the above-described process, it has been found convenient to include a voltmeter 48 to indicate the potential applied to cathode 20, an ammeter 49 for determining the total beam current, a voltmeter 50 for measuring the potential of control electrode 21 with respect to cathode 20 and a voltmeter 51 for indicating the anode voltage with respect to cathode 20. These instruments make it possible to adjust the beam current and velocity so that a junction layer of desired properties is formed. The beam should be adjusted so that the charged particles are absorbed by the surface portion of modifier 35 and do not penetrate semi-conductor 34 to an extent which would alter the characteristics of the semi-conductor crystal lattice.

Because the properties of semi-conductor 34 and modifiers 35 and 37, as well as the characteristics desired for the junction layer, may vary considerably, it is not possible to define precise optimum values for the accelerating voltages, the beam current, or the processing time. It should be noted that the characteristics of the transistor depend to a great extent upon the thickness of the undisturbed germanium, which in turn depends upon the original thickness of the semi-conductor, the temperature to which the elements are heated (diffusion is temperature-dependent) and the duration of the heating cycle (the penetration of the diffusing modifier particles is a function of the square root of the process time). However, for semi-conductor and modifier elements of known properties, the time and electrical conditions required to prepare a junction-type device having given characteristics may be determined with a minimum of experimentation. In this connection, the apparatus illustrated in Figure 1 is particularly advantageous in that its inherent low heat capacity makes it possible to bring the modifier to the desired alloying temperature very rapidly, thus minimizing any uncertainties as to the effective processing time.

The apparatus of the invention has been employed to produce semi-conductor devices with marked successes; diodes having back-voltage limits consistently in excess of 250 volts have been made. The following operating data is included purely by way of illustration and in no sense as a limitation; it is intended to provide a concrete example of the electrical conditions and time which may be employed in utilizing the apparatus of Figure 1.

| | |
|---|---|
| Accelerating voltage (voltmeter **51**)__kilovolts__ | +20 |
| Beam current (ammeter **49**)____microamperes__ | 100 |
| Control potential (voltmeter **40**)________volts__ | −100 |
| Beam diameter at anode **27**______millimeters__ | 1 |
| Process time______________________minutes__ | 5 |

The voltages indicated are, of course, taken with respect to cathode 20.

Formation of junction layers with the inventive apparatus makes it possible to fix the position of the layer upon the semi-conductor surface with extreme accuracy. Furthermore, the precise control of temperature developed in the process precludes any possibility of damaging the semi-conductor itself. The structure illustrated in Figures 1 and 2 is particularly simple and economical and permits the alloying of two junctions on opposite sides of the same germanium element by simple rotation of the composite cap-anode structure. The identical process and apparatus may be utilized to prepare an n-type layer upon a base element of p-type germanium by using antimony or a similar donor element as the modifier. Because the electrical characteristics of the junction are to a considerable extent determined by the alloying temperature and processing time, the precise control of these factors afforded by the method and apparatus is of considerable advantage in producing transistors or similar semi-conductor devices having predetermined characteristics.

While a particular embodiment of the present invention has been shown and described, it is apparent that changes and modifications in both the apparatus and process may be made without departing from the invention in its broader aspects. The aim of the appended claims, therefore, is to cover all such changes and modifications as fall within the true spirit and scope of the invention.

We claim:

1. Apparatus for the manufacture of alloy junction transistors comprising: an envelope comprising an electron-gun section and an anode section, said anode section including an anode-entrance opening; an anode structure, adapted to be inserted through said anode-entrance opening for removable mounting within said anode section of said envelope, said anode structure including a receptacle portion disposed in a predetermined position within said anode section of said envelope for securely holding a semi-conductor body having a pair of opposing surfaces with a modifier pellet disposed on a limited portion of each of said surfaces; an electron-impermeable mask included in said anode structure for masking all but said limited portion of each of said opposing surfaces; removable means for sealing said anode-entrance opening; means for evacuating said envelope; means including an electron gun mounted within said electron-gun section of said envelope for projecting a stream of electrons to impinge upon said receptacle portion of said anode structure; and means for rotating said receptacle portion to selectively expose different sides of said receptacle portion to said electron stream.

2. Apparatus for the manufacture of alloy junction transistors comprising: an envelope comprising an electron-gun section and an anode section, said anode section including an anode-entrance opening; an anode structure, adapted to be inserted through said anode-entrance opening for removable mounting within said anode section of said envelope, said anode structure including a plurality of receptacle portions disposed in a predetermined position within said anode section of said envelope for individually securely holding semi-conductor bodies each having a pair of opposing surfaces with a modifier pellet disposed on a limited portion of each of said surfaces; removable means for sealing said anode-entrance opening; means for evacuating said envelope means including an electron gun mounted within said electron-gun section of said envelope for projecting a stream of electrons toward said anode structure; means for focusing and deflecting said electron stream to selectively impinge upon limited areas of each of said receptacle portions; and means for rotating said receptacle portions to selectively expose opposite sides of said receptacle portions to said electron stream.

3. Apparatus for the manufacture of alloy junction transistors comprising: an envelope comprising an electron-gun section and an anode section with the latter including an anode-entrance opening; an anode structure insertable through said anode-entrance opening for removable mounting within said anode section, said anode structure including a receptacle portion disposed in a predetermined position within said anode section of said envelope for securely holding a semi-conductor body with a modifier pellet disposed on limited portion of a surface of said body; an electron-impermeable mask included in said anode structure for masking all but said limited portion of said body surface; a coating of fluorescent material disposed on the exterior surface of said electron-impermeable mask facing said electron-gun section; removable means for sealing said anode-entrance opening; means for evacuating said envelope; and means including an electron gun mounted within said electron-gun section of said envelope for projecting a stream of electrons to impinge upon said receptacle portion of said anode structure.

References Cited in the file of this patent

UNITED STATES PATENTS

| | | |
|---|---|---|
| 2,417,213 | Picard | Mar. 11, 1947 |
| 2,771,568 | Steigerwald | Nov. 20, 1956 |

FOREIGN PATENTS

| | | |
|---|---|---|
| 714,612 | Great Britain | Sept. 1, 1954 |
| 714,613 | Great Britain | Sept. 1, 1954 |